(12) United States Patent
Yamamoto et al.

(10) Patent No.: US 7,102,734 B2
(45) Date of Patent: Sep. 5, 2006

(54) EXPOSURE APPARATUS

(75) Inventors: Takeshi Yamamoto, Kanagawa (JP); Yutaka Watanabe, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/101,277

(22) Filed: Apr. 7, 2005

(65) Prior Publication Data

US 2005/0225741 A1    Oct. 13, 2005

(30) Foreign Application Priority Data

Apr. 9, 2004  (JP)  ............................. 2004-116017

(51) Int. Cl.
*G03B 27/54* (2006.01)
*G03B 27/42* (2006.01)
*G03F 1/00* (2006.01)

(52) U.S. Cl. ............................. 355/67; 355/53; 430/5

(58) Field of Classification Search ................. 355/52, 355/53, 55, 67, 77; 430/5, 20, 30; 378/34, 378/35
See application file for complete search history.

(56) References Cited

U.S. PATENT DOCUMENTS 5,052,033 A * 9/1991 Ikeda et al. ................... 378/35
6,228,512 B1   5/2001 Bajt et al.
6,333,961 B1 * 12/2001 Murakami ..................... 378/35
6,985,211 B1 *  1/2006 Singh et al. ................... 355/69
2003/0147058 A1 * 8/2003 Murakami et al. ............ 355/53

FOREIGN PATENT DOCUMENTS

JP    1-175736    7/1989

* cited by examiner

*Primary Examiner*—Henry Hung Nguyen
(74) *Attorney, Agent, or Firm*—Morgan & Finnegan, L.L.P.

(57) ABSTRACT

An exposure apparatus for exposing a mask pattern onto an object by using a light with wavelength of approximately 11 nm, said exposure apparatus including a projection optical system that includes a reflection-type optical element that has a multilayer film including a Be layer, and a reflection-type mask including a multilayer film that includes a first layer that has a first refractive index, and a second layer that has a second refractive index that has a real part that is larger than a real part of the first refractive index, said reflection-type mask includes the mask pattern, wherein said the first layer includes a beryllium, chrome, cobalt, niobium, molybdenum, technetium, ruthenium, rhodium, palladium, or tungsten, wherein said the second layer includes a lithium, boron, carbon, nitrogen, oxygen, fluorine, silicon, aluminum, titanium, scandium, iron, germanium, lanthanum, magnesium, tungsten, strontium, yttrium, or zirconium.

3 Claims, 11 Drawing Sheets

EXPOSURE APPARATUS

BACKGROUND OF THE INVENTION

The present invention relates generally to an exposure apparatus, and more particularly to multilayer film structure used for an optical element of an exposure apparatus. The present invention is suitable for an exposure apparatus that exposes an object, such as a single crystal substrate and a glass plate for a liquid crystal display ("LCD") by using extreme ultraviolet ("EUV") light with a wavelength of approximately 11 nm.

In a projection exposure apparatus that manufactures a semiconductor device as a semiconductor memory and a logic circuit, not only fine fabrication but also improvement of productivity and safety of operation are demanded. The method of shortening an exposure wavelength is used generally as a means to fabricate the fine pattern and to improve the resolution of the exposure apparatus. Recently, an EUV exposure apparatus using EUV light with a wavelength of 10 to 15 nm has been proposed to efficiently transfer a very fine circuit pattern. Especially, a light with a wavelength of approximately 13.5 nm is generally widely used.

As the light absorption in a material greatly increases in a wavelength range of the EUV light, making impractical a refraction-type optical system for visible light and ultraviolet light, a reflection-type or catoptric optical system is used for the EUV exposure apparatus.

EUV exposure apparatus uses a multilayer mirror that can obtain high reflectivity as a reflection-type optical element. The multilayer mirror, that alternately forms or layers two kinds of materials on a plane substrate, and a number of lamination layer is about 40 layers. The multilayer mirror is used for not only the reflection-type optical element but also a reflection-type mask. In this case, the mask as an original edition uses a reflection-type mask that formed a pattern to be transferred with an absorber on a mirror, and a reflection-type mask that fabricated a pattern to be transferred to a mirror.

The combination of the laminated films is selected according to the wavelength of the EUV light. For instance, if the wavelength is approximately 13.5 nm, the multilayer mirror that combines the molybdenum (Mo) layer and the silicon (Si) layer has the highest reflectivity. Therefore, when the wavelength is approximately 13.5 nm, Mo/Si is generally used for the multilayer (for instance, referring to Japanese Patent Application, Publication No. 1-175736).

However, it is necessary to improve throughput greatly because of the recent demand for the improvement of the productivity. There is a demand for light with a light intensity greater than a light intensity of approximately 13.5 nm wavelength light. Therefore, the use of the wavelength of approximately 11 nm that has a light intensity 2.2 times larger than the light intensity of 13.5 nm is examined (for instance, referring to U.S. Pat. No. 6,228,512). In this case, when the multilayer film that consists of the beryllium (Be) and the molybdenum (Mo) are used for the multilayer mirror, the reflectivity is the highest, and use of the reflection-type optical element and the reflection-type mask is proposed.

However, Be has limitations based on the safety concerns in it's safety (for instance, referring to Chemical safety (hazard) evaluation sheet (Official gazette notification reference No. 1-284, Pollutant Release and Transfer Register), CAS No. 7440-41-7). Therefore, mask containing Be needs to handle a large exhaust amount. In this case, the reflection-type mask that uses Be is especially a problem. A reflection-type optical element that is part of the projection optical system is arranged inside of a vacuum chamber of the exposure apparatus and sealed, so that it is not especially a problem because the exchange frequency is small when the reflection-type optical element is arranged in the vacuum chamber. On the other hand, because the reflection-type mask is exchanged for a different mask in each process, there are many used masks. Therefore, safety is a problem because a frequency that the reflection-type mask is removed to outside of the vacuum chamber increases.

BRIEF SUMMARY OF THE INVENTION

Accordingly, it is an exemplary object of the present invention to provide an exposure apparatus that maintains safety, enables fine fabrication, and has high productivity.

An exposure apparatus of one aspect according to the present invention for exposing a mask pattern onto an object by using a light with wavelength of approximately 11 nm, said exposure apparatus comprising a projection optical system that includes a reflection-type optical element that has a multilayer film including a Be layer, and a reflection-type mask comprising a multilayer film that includes a first layer that has a first refractive index, and a second layer that has a second refractive index that has a real part that is larger than a real part of the first refractive index, said reflection-type mask includes the mask pattern, wherein said the first layer includes a beryllium, chrome, cobalt, niobium, molybdenum, technetium, ruthenium, rhodium, palladium, or tungsten, wherein said the second layer includes a lithium, boron, carbon, nitrogen, oxygen, fluorine, silicon, aluminum, titanium, scandium, iron, germanium, lanthanum, magnesium, tungsten, strontium, yttrium, or zirconium.

A device fabrication method of another aspect of the present invention includes the step of exposing an object using an exposure apparatus, and performing a development process for the object exposed, wherein an exposure apparatus for exposing a mask pattern onto the object by using a light with wavelength of approximately 11 nm, said exposure apparatus comprises a projection optical system which includes a reflection-type optical element that has a multilayer film including a Be layer, and a reflection-type mask which includes a multilayer film that includes a first layer that has a first refractive index, and a second layer that has a second refractive index that has a real part that is larger than a real part of the first refractive index, said reflection-type mask includes the mask pattern, wherein said the first layer includes a beryllium, chrome, cobalt, niobium, molybdenum, technetium, ruthenium, rhodium, palladium, or tungsten, wherein said the second layer includes a lithium, boron, carbon, nitrogen, oxygen, fluorine, silicon, aluminum, titanium, scandium, iron, germanium, lanthanum, magnesium, tungsten, strontium, yttrium, or zirconium.

Other objects and further features of the present invention will become readily apparent from the following description of the preferred embodiments with reference to the accompanying drawings.

DETAILED DESCRIPTION OF THE PREFERRED EMBODIMENTS

Figure 1:
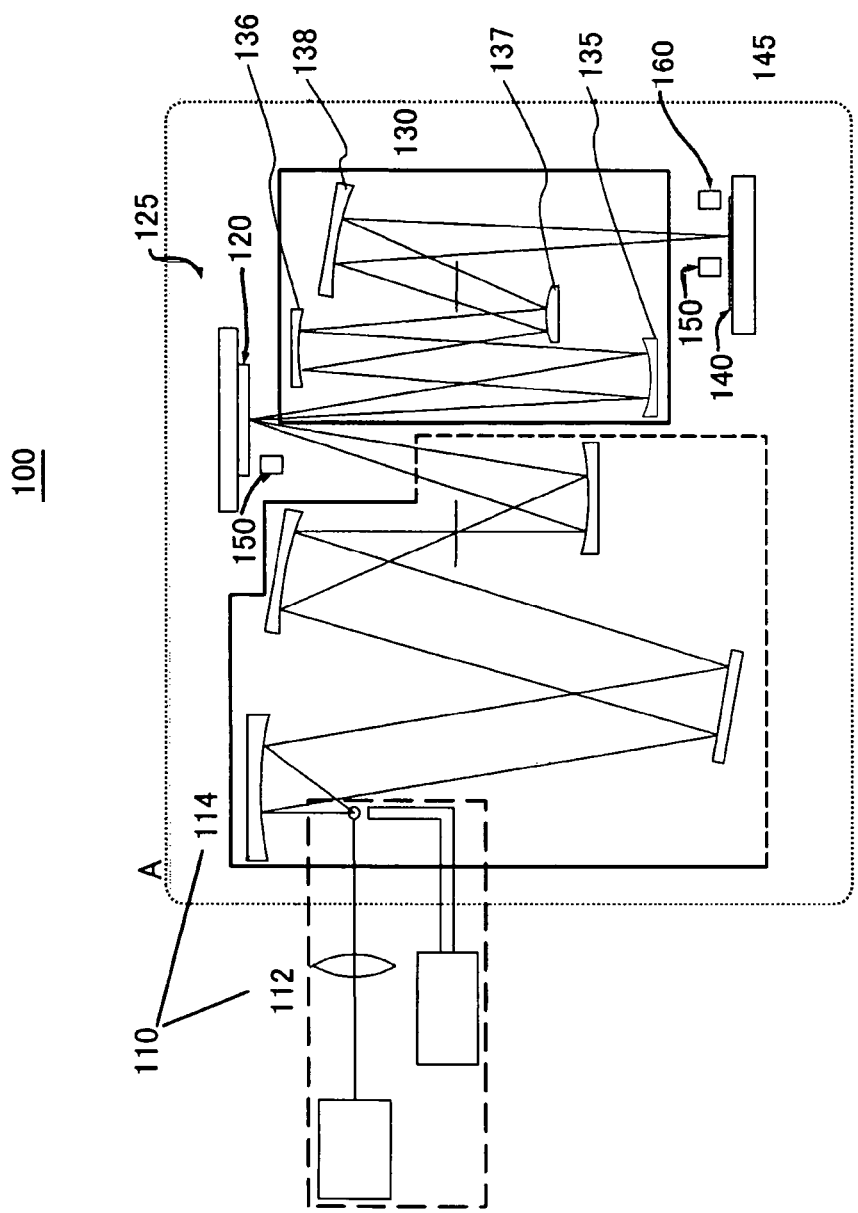
FIG. 1 is a schematic structure view of an EUV exposure apparatus as one aspect according to the present invention.

With reference to the accompanying drawings, a description will be given of an EUV exposure apparatus 100 of one embodiment according to the present invention. Here, FIG. 1 is a structure view of the EUV exposure apparatus 100. The EUV exposure apparatus 100 is a projection exposure apparatus that uses, as illumination light for exposure, EUV light (e.g., with a wavelength of approximately 11 nm) to perform a step-and-scan exposure that transfers a circuit pattern on a mask onto an object to be exposed.

The EUV exposure apparatus 100 includes, as shown in FIG. 1, an illumination apparatus 110, a reflection-type mask 120, a mask stage 125 that mounts the reflection-type mask 120, a reflection-type projection system 130, an object 140, wafer stage 145 that mounts the object 140, an alignment detection mechanism 150, and a focus position detecting mechanism 160.

An optical path through which EUV light passes is preferably maintained in vacuum atmosphere A due to the low transmittance of EUV light through air.

The illumination apparatus 110 uses arc EUV light corresponding to an arc field in the reflection-type projection optical system 130, to illuminate the reflection-type mask 120, and includes an EUV light source 112 and an illumination optical system 114.

The EUV light source 112 uses, for example, a laser plasma light source. It generates high temperature plasma by irradiating a pulsed laser beam with high intensity onto a target material in a vacuum chamber, and uses the EUV light, for example, with a wavelength of about 11 nm, which has been emitted from the plasma. The target material may use a metallic thin film, a gas jet, a liquid-drop, etc. The pulse laser is usually driven with a higher repetitive frequency, such as several kHz, for increased average intensity per pulse and stabilized the average intensity each unit time of radiated EUV light.

Figure 2:
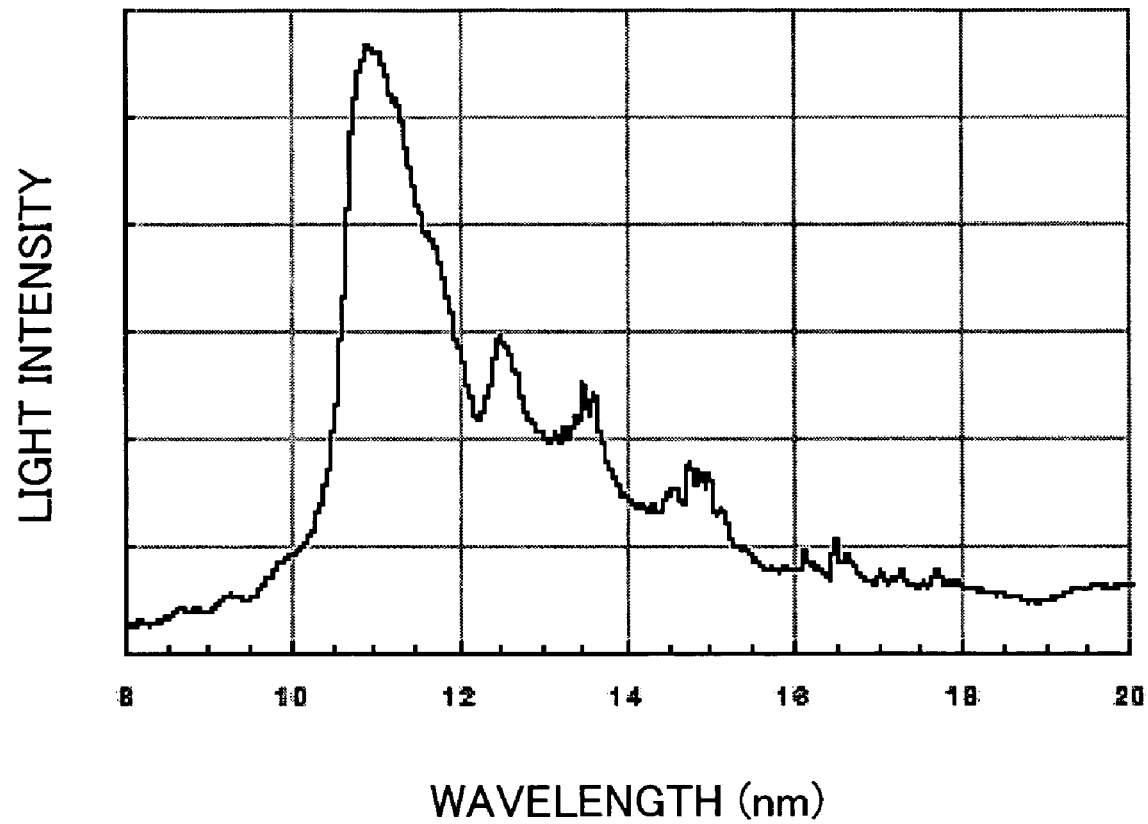
FIG. 2 is a graph of a spectrum distribution when Xe is selected in a target material as a light source of the EUV exposure apparatus of the present invention shown in FIG. 1.

The EUV light source 112 irradiates, for example, a laser beam to a gas jet of Xe, thus generating high-temperature plasma which emits a light. Xe is an inert gas, is often used as the target material of the EUV light because Xe produces little debris when the Xe plasma is generated. As shown in FIG. 2, the EUV light source 112 is that the light intensity of wavelength of approximately 11 nm is the largest, and is about 2.2 times greater than the light intensity of wavelength of approximately 13.5 nm. Here, FIG. 2 is a graph of a spectrum distribution when Xe is selected in the target material. If the light intensity is large, throughput improves because the irradiation time to the wafer is shortened, and the productivity of the semiconductor substrate improves. The light intensity in the EUV exposure apparatus 100 that uses the light with wavelength of approximately 11 nm is about 2.2 times greater than the intensity of the light with wavelength of approximately 13.5 nm. As a result, the EUV exposure apparatus 100 can shorten the irradiation time to the wafer, and can improve the productivity more than the conventional exposure apparatus.

The illumination optical system 114 includes a condenser mirror and an optical integrator. The condenser mirror condenses EUV light that is radiated approximately isotropically from the laser plasma light source. The optical integrator uniformly illuminates the reflection-type mask 120 with a predetermined numerical aperture. The illumination optical system 114 further includes an aperture at a position optically conjugate with the reflection-type mask 120, which limits an illumination area of the reflection-type mask 120 to an arc shape. The illumination optical system 114 includes a grazing incidence total reflection mirror or a multilayer mirror 130a of the instant embodiment explained as follows.

In the wavelength range of the EUV light, a real part of the refractive index without an absorption edge is slightly smaller than 1. Therefore, the angle of incidence is large and the EUV light closely incidents on a reflection surface becoming total reflection. The grazing incidence total reflection mirror uses this phenomenon, and, usually, when the range of an angle from the reflection surface is greater than 0 and less than 20 degrees, high reflectivity of 80% or more can be obtained. However, a freedom in an optical design of the grazing incidence total reflection mirror is small because of the limitation of the incident angle, and the optical system enlarges. Therefore, the grazing incidence total reflection mirror is properly used for the multilayer mirror 130a according to the purpose.

The reflection-type mask 120 has a circuit pattern (or image) to be transferred, and supported and driven by the mask stage 125. The diffracted light from the reflection-type mask 120 is reflected by the reflection-type projection optical system 130 and projected onto the object 140. The reflection-type mask 120 and the object 140 are arranged optically conjugate with each other. The EUV exposure apparatus 100 is a step-and-scan exposure apparatus, and projects a reduced size of the pattern on the reflection-type mask 120 on the object 140 by scanning the reflection-type mask 120 and the object 140.

The reflection mask 120 and an optical element 135 to 138 that composes the reflection-type projection optical system 130 uses the multilayer mirror with large freedom in the optical design.

The multilayer mirror, that alternately forms or layers two kind of materials having different optical constants (refractive indices), can use the incident angle near the vertical incidence better than the grazing incidence total reflection mirror. The multilayer mirror can obtain the reflectivity of about 70% by appropriately setting the materials of the layers and number of lamination layer.

Figure 3:
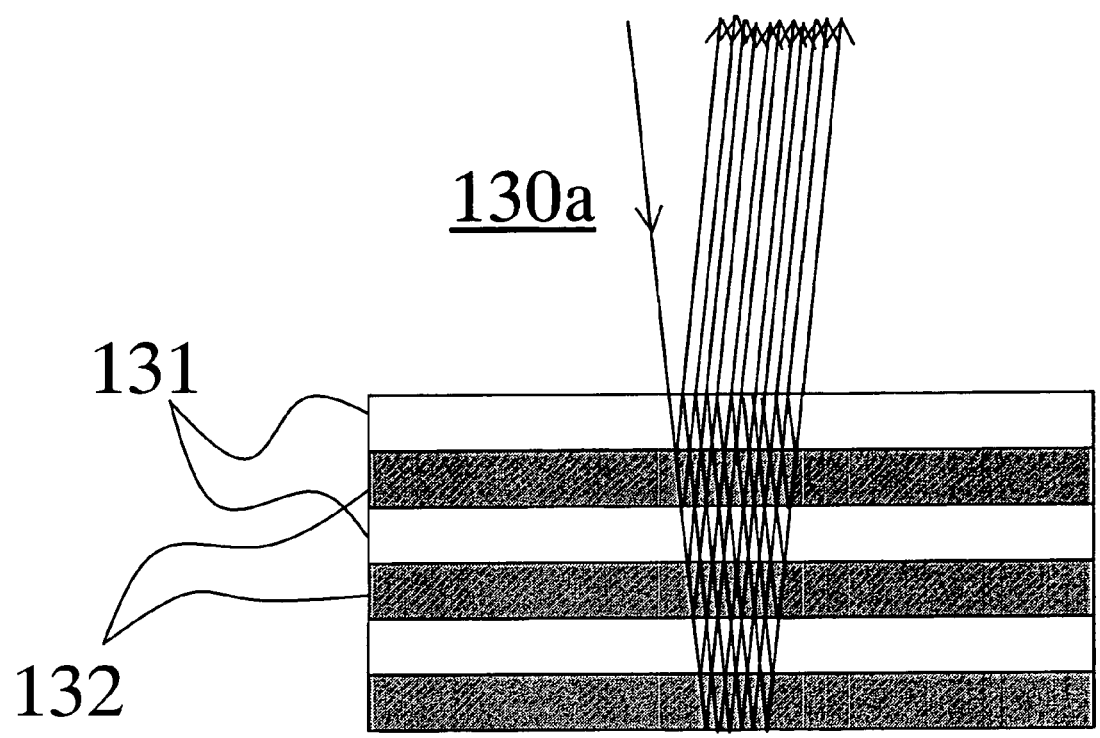
FIG. 3 is a schematic sectional view of a structure of a multilayer mirror used as a reflection-type projection optical system of the EUV exposure apparatus of the present invention shown in FIG. 1.

The multilayer mirror 130a, that alternately forms or layers two kinds of materials 131 and 132 with different reflectivity on a plane substrate, and when the light is incident on an interface of the materials 131 and 132 with different refractive index, the multilayer mirror 130a reflects the light at the interface. The reflectivity at a single interface is small, and 1% or less. However, the light reflected at each interface interferes each other, consequently, the reflectivity of only about 70% can be obtained. Here, FIG. 3 is a sectional view of the optical elements 135 to 138 that composes the reflection-type projection optical system 130 of the EUV exposure apparatus 100.

Figure 4:
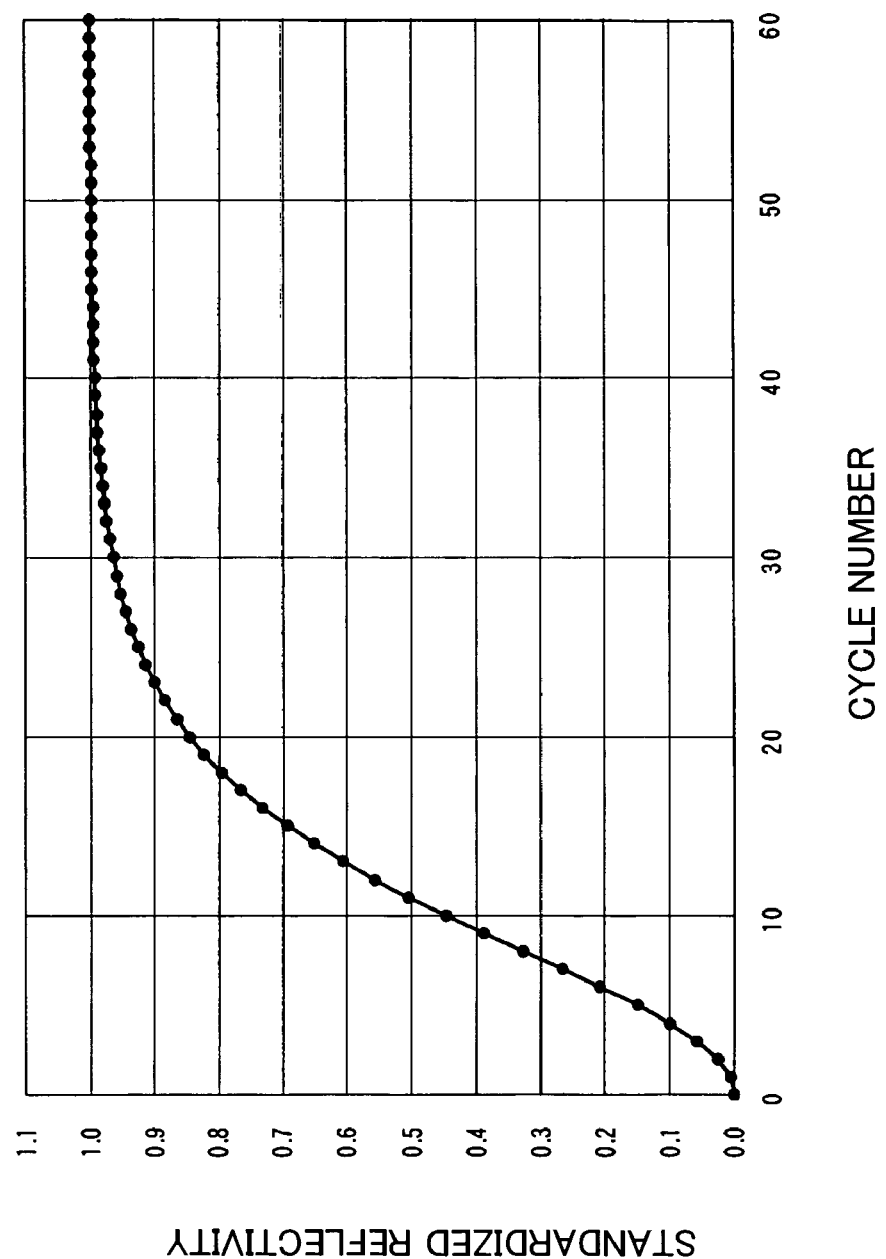
FIG. 4 is a graph of a reflectivity characteristic of the multilayer mirror shown in FIG. 3.

The reflectivity of the multilayer mirror depends on the number of the multilayer (cycle number). FIG. 4 shows the reflectivity characteristic of the multilayer mirror. FIG. 4 uses the cycle number of the multilayer for the abscissa axis and a reflectivity standardized by the maximum value of reflectivity for the ordinate axis. Referring to FIG. 4, the reflectivity greatly increases according to an increase in the cycle number of the multilayer until about 40 layers. The reflectivity improves minimally at more than 40 layers. Therefore, the multilayer may form more than 40 layers to obtain high reflectivity.

Figure 5:
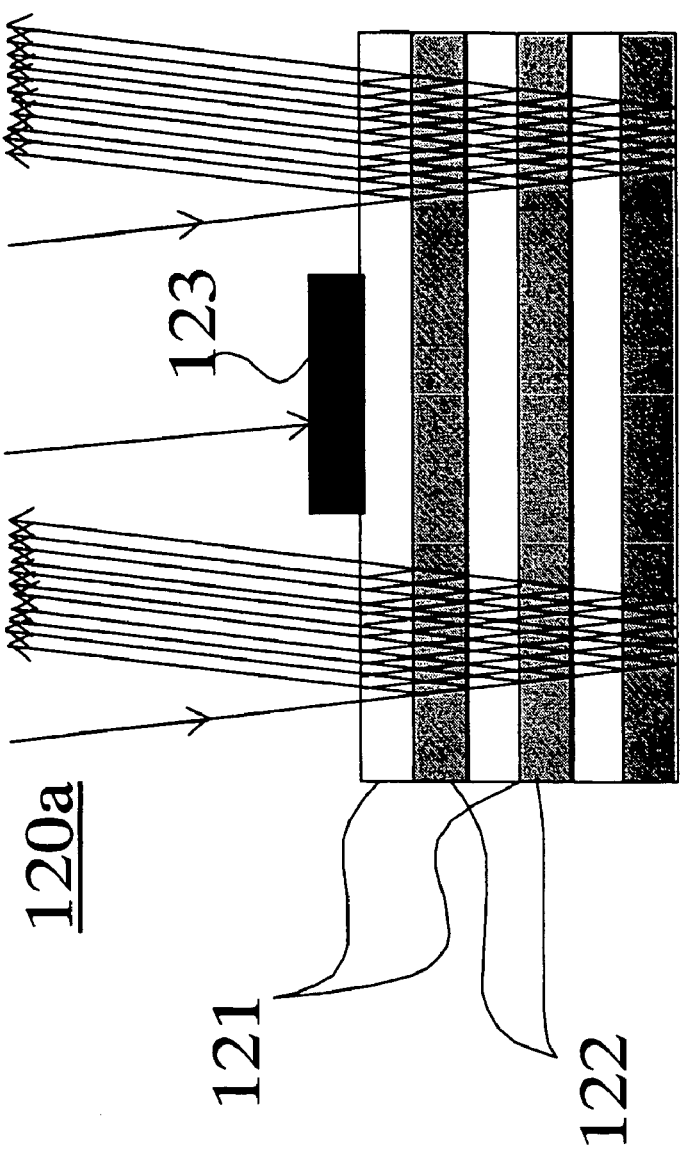
FIG. 5 is a schematic sectional view of a structure of a multilayer mirror used as a reflection-type mask of the EUV exposure apparatus of the present invention shown in FIG. 1.

FIG. 5 is a sectional view of a structure of the multilayer mirror 120a used as the reflection-type mask 120, and an absorber 123 that forms the pattern of the mask is arranged on the multilayer mirror. The pattern of the reflection-type mask 120 may be formed, as shown in FIG. 5, with arranging the absorber 123 on the multilayer mirror or fabricating of the mirror.

The reflection-type mask 120 is formed by alternately forming or layering Mo layer and Y (yttrium) layer on a precisely polished glass plate. The thickness of the layer is decided according to the wavelength of the exposure light etc., and for example, a Mo layer is about 3.48 nm thickness, and a Y layer is about 2.32 nm thickness. A sum of thickness of two kinds of materials is generally called a coating cycle, which is 3.48 nm+2.32 nm=5.80 nm in the above example. The multilayer mirror reflects EUV light with a specific wavelength when receiving EUV light. Efficiently reflected EUV light is one within a narrow bandwidth around λ that satisfies Equation 1 below where λ is a wavelength of the reflected EUV light, θ is an incident angle and d is a coating cycle and the bandwidth is about 0.6 to 1 nm:

$$2 \times d \times \cos\theta = \lambda \quad (1)$$

Equation 2 is a general type that shows the refractive index of material that uses real and imaginary parts.

$$n = 1 - d - i\beta \text{ (i is imaginary unit)} \quad (2)$$

The reflection-type mask 120a shown in FIG. 5 selects a material that the real part of the refractive index shown in Equation 2 is small compared with wavelength of the used EUV to one side of the formed materials 121 and 122, and selects a material that the real part of the refractive index is large compared to the other side. As a result, reflectivity in the interface between each layers can be improved. The material that the real part of the refractive index is small may consist of vanadium (V), chrome (Cr), cobalt (Co), niobium (Nb), molybdenum (Mo), technetium (Tc), ruthenium (Ru), rhodium (Rh), palladium (Pd), and tungsten (W), etc. The material that the real part of the refractive index is large may consist of lithium (Li), boron carbide (B4C), boron nitride (BN), silicon (Si), aluminum (Al), titanium (Ti), scandium (Sc), iron (Fe), germanium (Ge), lanthanum (La), magnesium (Mg), fluorine (F), tungsten (W), strontium (Sr), yttrium (Y), and zirconium (Zr), etc. The difference of the real part of the refractive index of the material 121 and the material 122 may need to be 0.02 or more to improve reflectivity in the interface of the material 121 and the material 122. The materials 121 and 122 may of a material where the imaginary part of the refractive index is small.

The mask stage 125 supports the reflection-type mask 120 and is connected to a moving mechanism (not shown). The mask stage 125 may use any structure known in the art. A moving mechanism (not shown) may include a linear motor etc., and drives the mask stage 125 at least in a direction X and moves the reflection-type mask 120. The EUV exposure apparatus 100 assigns the direction X to scan the reflection-type mask 120 or the object 140, a direction Y perpendicular to the direction X, and a direction Z perpendicular to the reflection-type mask 120 or the object 140.

The reflection-type projection optical system 130 uses plural multilayer mirrors to project a reduced size of a pattern formed on the reflection-type mask 120 onto the object 140. The number of mirrors is about four to six. For wide exposure area with the small number of mirrors, the reflection-type mask 120 and object 140 are simultaneously scanned to transfer a wide area that is an arc-shaped area or ring field apart from the optical axis by a predetermined distance. The reflection-type projection optical system 130 has a NA of about 0.1 to 0.3.

The reflection-type projection optical system 130 uses as a multilayer mirror that alternately forms or layers two kinds of materials, e.g., molybdenum (Mo)/beryllium (Be), having different optical constants on a precisely polished glass plate. For example, a molybdenum layer is about 3.36 nm thick, a beryllium layer is about 2.24 nm thick, and a coating cycle is 5.60 nm.

The reflectivity of the EUV light would be about 0.7 at most. Non-reflected EUV light is absorbed in the multilayer film or plate, and most of the energy is consumed as heat. The number of multilayer mirrors should be maintained minimum for maximum reflectance in the entire optical system. Therefore, the reflection-type projection optical system 130 for the EUV light includes, generally, about four to six multilayer mirrors.

The reflection-type projection optical system 130 of the instant embodiment may use the multilayer mirror that alternately forms Mo layer and Be layer for the multilayer mirrors 135 to 138. Therefore, EUV exposure apparatus 100 can obtain high reflectivity for the light with wavelength of approximately 11 nm, improves the light intensity irradiated to the object 140, and can improve the throughput.

The instant embodiment uses a wafer as the object 140 to be exposed, but it may include a spherical semiconductor and liquid crystal plate and a wide range of other objects to be exposed. Photoresist is applied onto the object 140. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

An object 140 to be exposed is held onto the wafer stage 145 by a wafer chuck. The wafer stage 145 moves the object 140, for example, using a linear stage in XYZ directions. The reflection-type mask 120 and the object 140 are synchronously scanned. The positions of the mask stage 125 and wafer stage 145 are monitored, for example, by a laser interferometer, and driven at a constant speed ratio.

The alignment detection mechanism 150 measures a positional relationship between the position of the reflection-type mask 120 and the optical axis of the projection-type projection optical system 130, and a positional relationship between the position of the object 140 and the optical axis of the projection-type projection optical system 130, and sets positions and angles of the mask stage 125 and the wafer stage 145 so that a projected image of the reflection-type mask 120 may be positioned in place on the object 140.

The focus detection optical system 160 measures a focus position in the direction Z on the object 140 surface, and control over a position and angle of the wafer stage 145 may always maintain the object 140 surface at an imaging position of the reflection-type projection optical system 130 during exposure.

Embodiment 1

Figure 6:
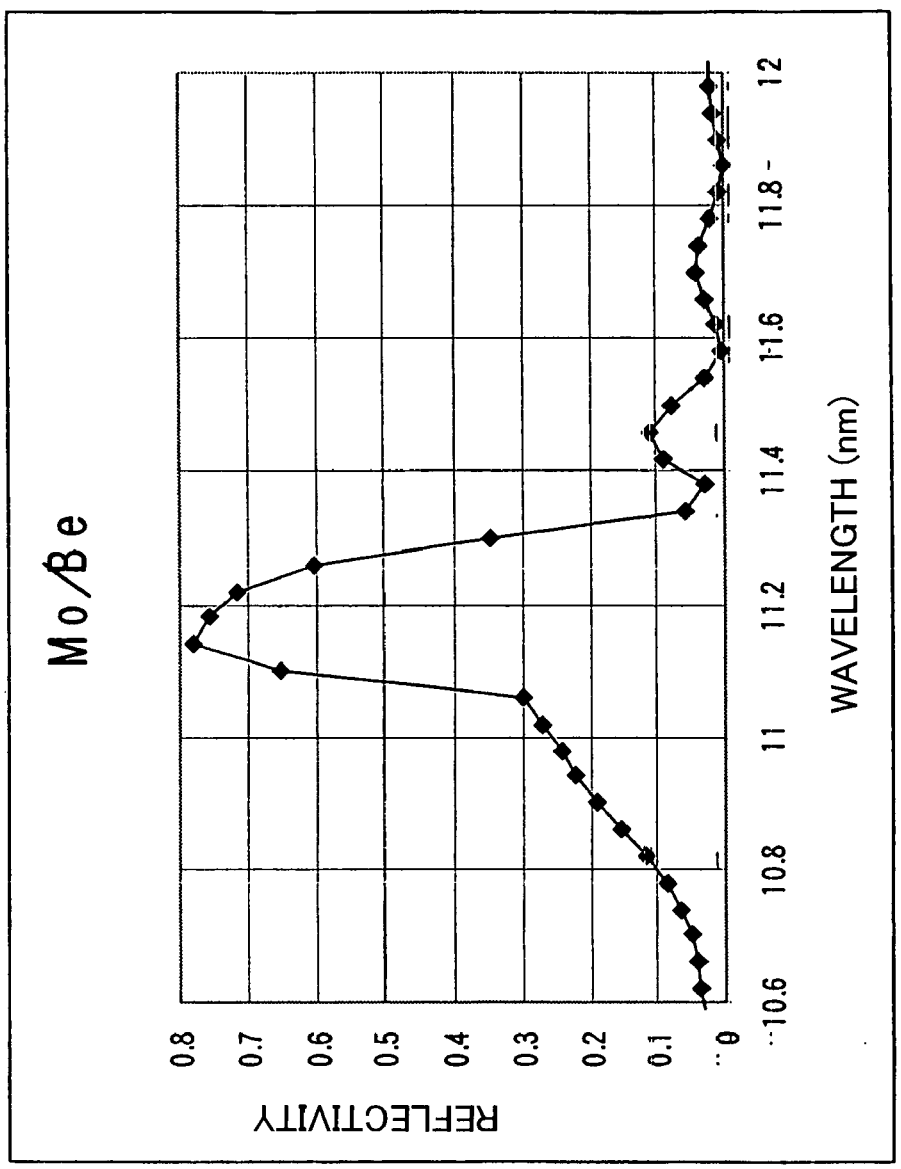
FIG. 6 is a graph of a reflectivity when Mo/Be is used for the multilayer mirror shown in FIG. 3.

Referring now to FIG. 6, a description will be given a reflectivity of multilayer film when the conventional Mo/Be multilayer film used for the multilayer mirrors 135 to 138 when the exposure light with wavelength of approximately 11 nm is used. Here, FIG. 6 is a graph of a reflectivity of the multilayer mirror whose a thickness of a Mo and Be layer is 5.6 nm, a thickness of Mo layer is the 40% of the Mo and Be layer, and the number of lamination layers is 40 layers.

The reflectivity shown in FIG. 6 is measured by a reflectometer. The reflectometer includes a light source, a spectroscope, and a light intensity sensor as a main part. The measurement of the reflectivivity is obtained from the ratio of the light intensity of the monochrome light filtered by the spectroscope and the light intensity reflected from sample. The spectroscope produces the monochrome light because the spectroscope allows only light of a specific wavelength to pass through. The light reflected by the sample is obtained by a sensor. The following reflectivity is also similar.

The reflectivity of the multilayer film for the EUV light shown in FIG. 6 can be the highest at approximately 11 nm, and obtain the reflectivity of 77.8%. As a result, the EUV exposure apparatus 100 that uses the multilayer mirror including Mo/Be of the instant embodiment can irradiate high light intensity to the object 140, enable fine fabrication, improve the throughput, and achieve high productivity.

Figure 7:
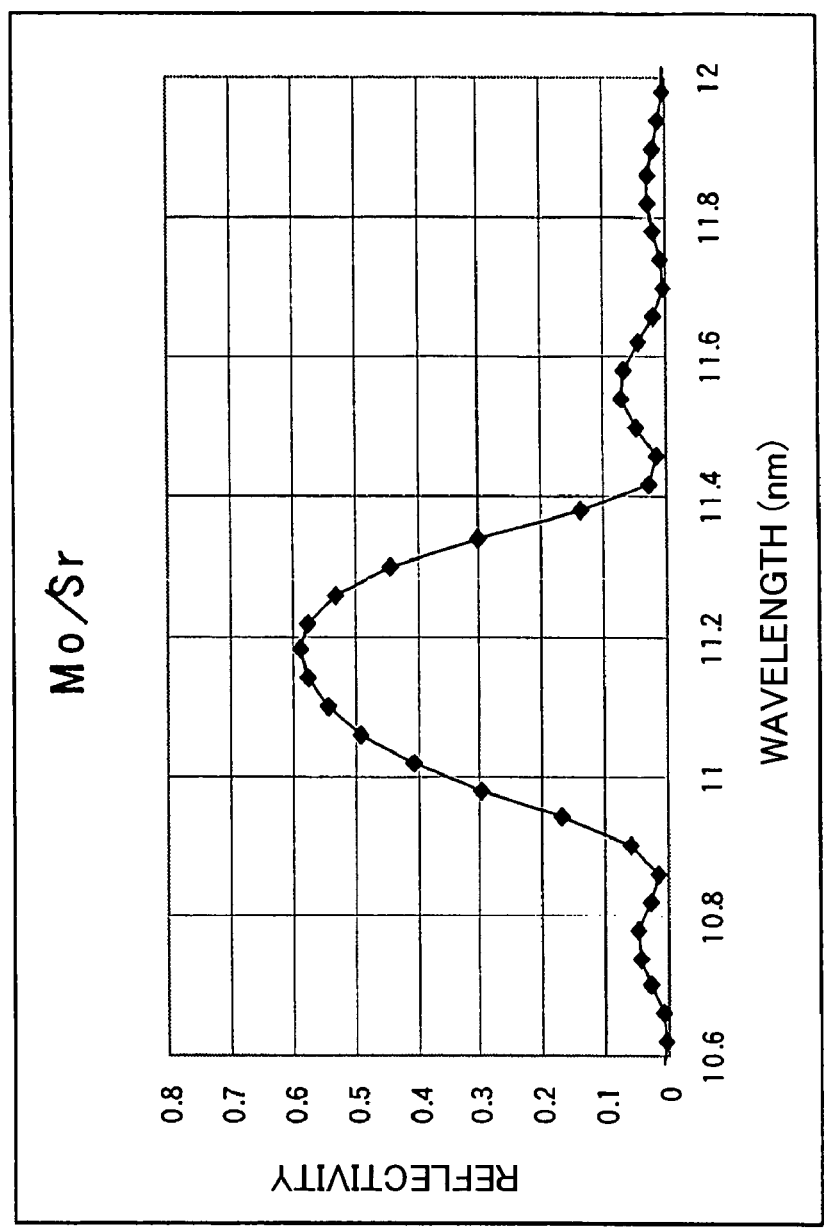
FIG. 7 is a graph of a reflectivity when Mo/Sr is used for the multilayer mirror shown in FIG. 3.

Referring now to FIG. 7, a description will be given a reflectivity of the multilayer film that uses Mo/Sr used for the reflection-type mask 120 in the instant embodiment. Here, FIG. 7 is a graph of a reflectivity of the multilayer mirror whose a thickness of a couple of the layers that consist of Mo and Sr is 5.7 nm, and number of lamination layer is 40 layers.

The reflectivity of the multilayer mirror for the EUV light shown in FIG. 7 can be the highest in the approximately 11 nm, and obtain the reflectivity of 58.5%. In this case, the reflectivity of the reflection-type mask that uses Mo/Sr is 58.5%, and is inferior to the reflectivity of Mo/Be (77.8%). However, when the light with the wavelength of approximately 11 nm is used, the light intensity from the light source is an intensity of about 2.2 times compared with the case that selects the light with the wavelength of approximately 13.5 nm used as the conventional exposure wavelength. The Mo/Si used for the exposure light with wavelength of approximately 13.5 nm as the multilayer mirror of the projection optical system has the reflectivity of about 74.1%, so the reflectivity of the entire projection optical system that uses six mirrors is improved to $(77.8/74.1)^6=1.34$. Therefore, even when the reflection-type mask that uses Mo/Sr is used, $2.2\times(58.5/74.1)\times(77.8/74.1)^6 = 2.3$ times a whole light intensity can be introduced on the wafer.

The exposure time of the object is shortened in proportion to an increase in the intensity of the exposure light. Therefore, when the exposure light with the wavelength of approximately 11 nm is used, safety is maintained by using the reflection-type mask that uses Mo/Sr, the fine fabrication becomes possible compared with the case to use the exposure light with wavelength of approximately 13.5 nm, and the exposure apparatus with high productivity can be provided.

For example, the throughput of the EUV exposure apparatus processes about 120 wafers of f 300 mm per an hour, the number of shots changes depending on the layout though it is assumed that the number of shots is 100, and the transfer time of the wafer is small enough, so the processing time per 1 shot is 0.3 seconds. When the half of this time is assumed to be the exposure time, the exposure time is 0.15 seconds. If the exposure time is calculated as 0.3 seconds of the twice, the number of processing wafer decreases, and becomes 80. As a result, the EUV exposure apparatus 100 that uses the multilayer mirror including Mo/Sr of the instant embodiment can greatly improve the throughput compared with the case using light with wavelength of approximately 13.5 nm as the exposure light, and can achieve high productivity. Moreover, because Be is not used for the material of the reflection-type mask 120, the safety can be maintained.

Embodiment 2

Figure 8:
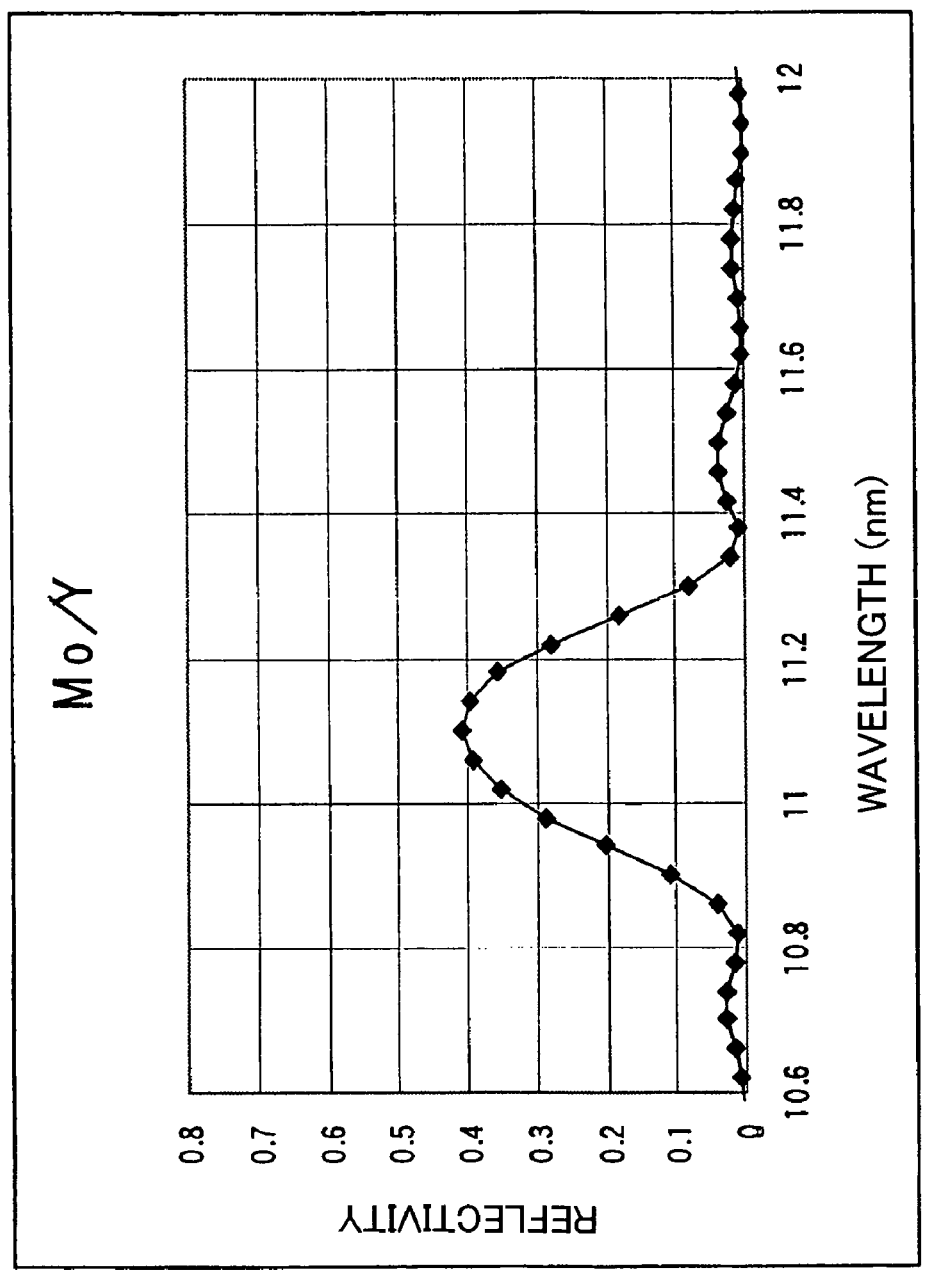
FIG. 8 is a graph of a reflectivity when Mo/Y is used for the multilayer mirror shown in FIG. 3.

Referring now to FIG. 8, a description will be given a reflectivity of the multilayer film that uses Mo/Y used for the reflection-type mask 120 in the instant embodiment. Here, FIG. 8 is a graph of a reflectivity of the multilayer mirror whose a thickness of a couple of the layer that consists of Mo and Y is 5.7 nm, and number of lamination layer is 40 layers.

The reflectivity of the multilayer film for the EUV light shown in FIG. 8 can be the highest in the approximately 11 nm, and obtain the reflectivity of maximum 40.8%.

Here, even if the exposure wavelength is assumed to be 11 nm, and Mo/Y is used as the mirror material of the reflection-type mask, the light intensity is very advantageous compared with the EUV light with the wavelength of approximately 13.5 nm. The light intensity is $2.2\times(40.8/74.1)\times(77.8/74.1)^6=1.62$ times when calculating as well as the embodiment 1.

As a result, the EUV exposure apparatus 100 of the instant embodiment that uses exposure wavelength of approximately 11 nm, and uses the reflection-type mask of Mo/Y can greatly improve the throughput compared with the case that uses the light with wavelength of approximately 13.5 nm as the exposure light, and can achieve high productivity. Moreover, because Be is not used for the material of the reflection-type mask 120, the safety can be maintained.

Embodiment 3

Figure 9:
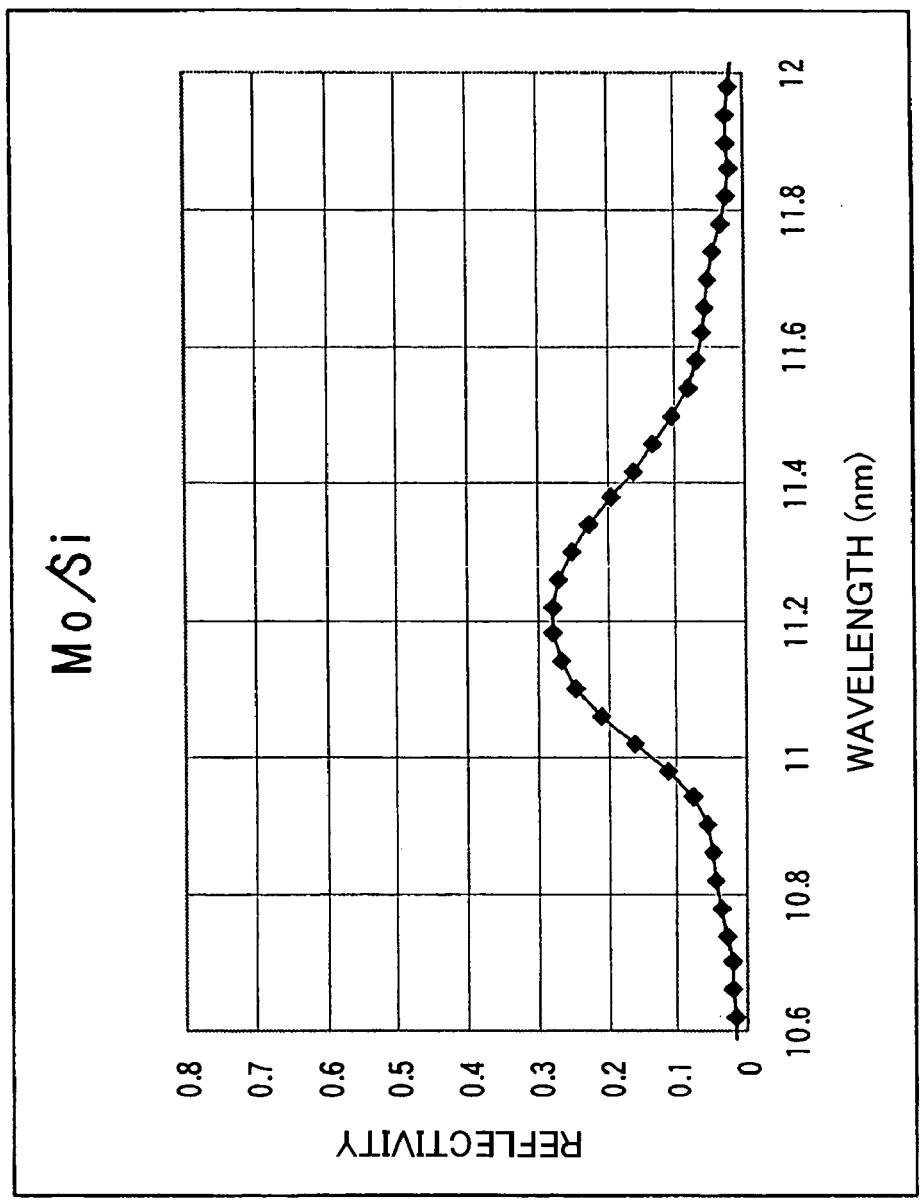
FIG. 9 is a graph of a reflectivity when Mo/Si is used for the multilayer mirror shown in FIG. 3.

Referring now to FIG. 9, a description will be given a reflectivity of the multilayer film that uses Mo/Si used for the reflection-type mask 120 in the instant embodiment. Here, FIG. 9 is a graph of a reflectivity of the multilayer mirror whose a thickness of a couple of the layer that consists of Mo and Si is 5.7 nm, and number of lamination layer is 40 layers.

The reflectivity of the multilayer film for the EUV light shown in FIG. 8 can be the highest in the approximately 11 nm, and obtain the reflectivity of maximum 27.9%.

Here, even if the exposure wavelength is assumed to be 11 nm, and Mo/Si is used as the mirror material of the reflection-type mask, the light intensity is very advantageous compared with the EUV light with the wavelength of approximately 13.5 nm. The light intensity is $2.2\times(27.9/74.1)\times(77.8/74.1)^6=1.11$ times when calculating as well as the embodiment 1.

As a result, the EUV exposure apparatus 100 that uses the multilayer mirror including the Mo/Si of the instant embodiment can greatly improve the throughput compared with the case that uses the light with wavelength of approximately 13.5 nm as the exposure light, and can achieve high productivity. Moreover, because Be is not used for the material of the reflection-type mask 120, the safety can be maintained.

Embodiment 4

The reflection-type mask 120 that uses a Ru/B4C multilayer film whose the coating cycle is 5.9 nm, the Ru layer is 2.36 nm, the B4C layer is 3.54 nm, and the number of lamination is 80 layers, can obtain the reflectivity of 52.7% for the wavelength of approximately 11 nm.

Similarly, the reflection-type mask 120 that uses a Ru/BN multilayer film whose the coating cycle is 5.9 nm, the Ru layer is 2.36 nm, the BN layer is 3.54 nm, and the number of lamination is 80 layers, can obtain the reflectivity of 41.9% for the wavelength of approximately 11 nm.

Similarly, the reflection-type mask 120 that uses a Rh/B4C multilayer film whose the coating cycle is 5.9 nm, the Rh layer is 2.36 nm, the B4C layer is 3.54 nm, and the number of lamination is 80 layers, can obtain the reflectivity of 51.9% for the wavelength of approximately 11 nm.

Similarly, the reflection-type mask 120 that uses a Rh/BN multilayer film whose the coating cycle is 5.9 nm, the Rh layer is 2.36 nm, the BN layer is 3.54 nm, and the number of lamination is 80 layers, can obtain the reflectivity of 42.2% for the wavelength of approximately 11 nm.

Similarly, the reflection-type mask 120 that uses a Rh/Y multilayer film whose the coating cycle is 5.9 nm, the Rh layer is 2.36 nm, the Y layer is 3.54 nm, and the number of lamination is 80 layers, can obtain the reflectivity of 59.9% for the wavelength of approximately 11 nm.

In each case, the light intensity is very advantageous compared with the case that uses the EUV light with wavelength of approximately 13.5 nm as the exposure light by using the wavelength of approximately 11 nm to the exposure wavelength, and using the above-mentioned multilayer film as the reflection-type mask 120. As a result, the EUV exposure apparatus 100 that uses the multilayer mirror including the embodiments 1 to 4 can greatly improve the throughput compared with the case to use the light with wavelength of approximately 13.5 nm as the exposure light, and can achieve high productivity. Moreover, because Be is not used for the material of the reflection-type mask 120, the safety can be maintained.

The fabrication methods of the multilayer mirror use the spatter methods such as the magnetron spatter method and the electron beam spatter method, etc., and the evaporation methods such as the electron beam evaporation method and the ion beam evaporation method, etc. Thereby, the explanation is omitted because it is well-known for a person with ordinary skill in the art.

In exposure, the EUV light emitted from the illumination apparatus 110 illuminates the reflection-type mask 120, and images a pattern formed on the reflection-type mask 120 onto the object 140 surface. The instant embodiment uses an arc or ring shaped image plane, scans the reflection-type mask 120 and object 140 at a speed ratio corresponding to a reduction rate to expose the entire surface of the reflection-type mask 120. Because the reflection-type projection optical system 130 of the instant embodiment uses the multilayer mirror including the Be layer, the reflection efficiency improves, and the throughput can be improved. On the other hand, the reflection-type mask 120 of the instant embodiment does not use Be, and is able to maintain the safety. As a result, the EUV exposure apparatus 100 maintains the safety, enables fine fabrication, and can improve the productivity.

Figure 10:
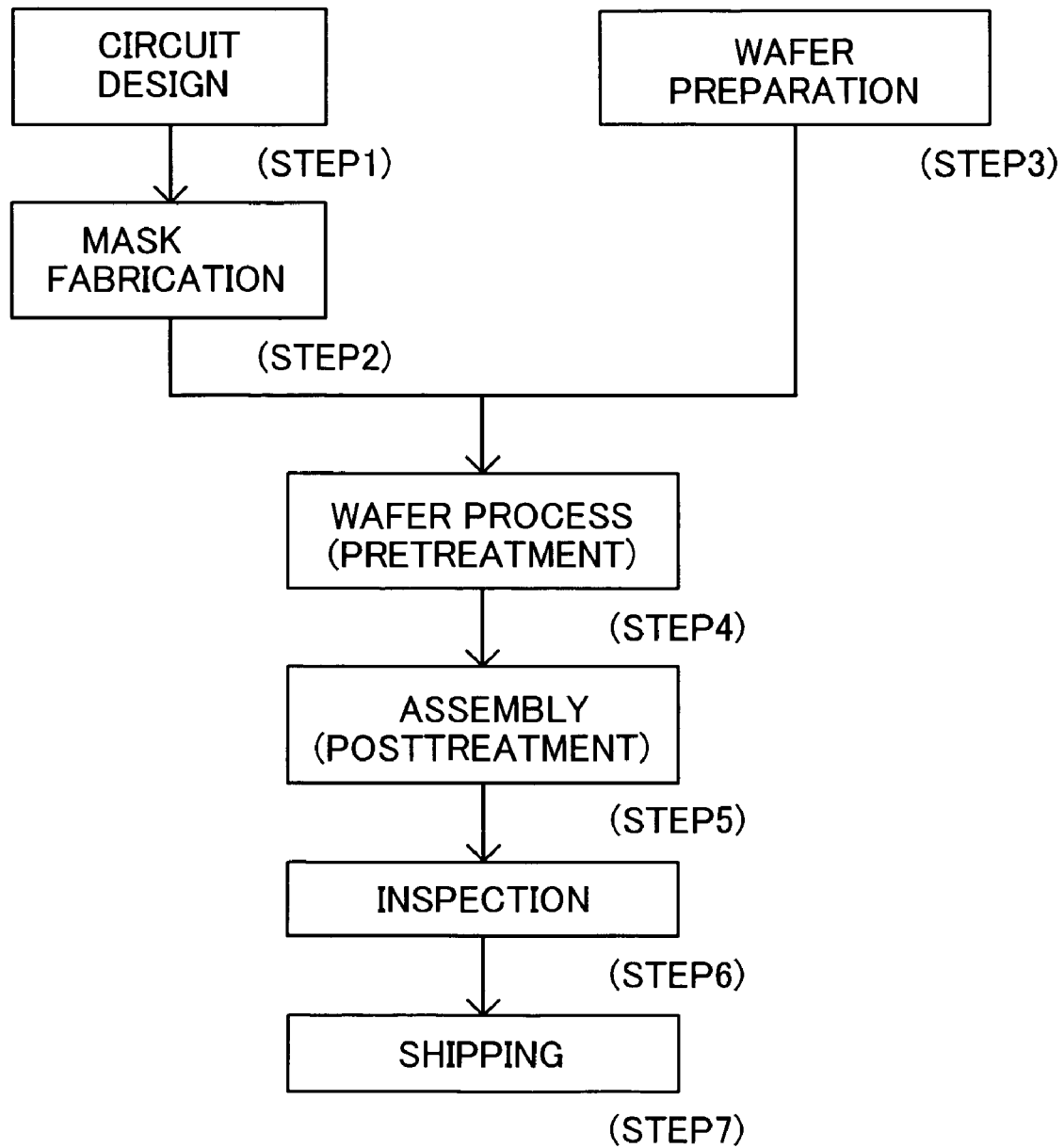
FIG. 10 is a flowchart for explaining how to fabricate devices (such as semiconductor chips such as ICs, LCDs, CCDs, and the like).
Figure 11:
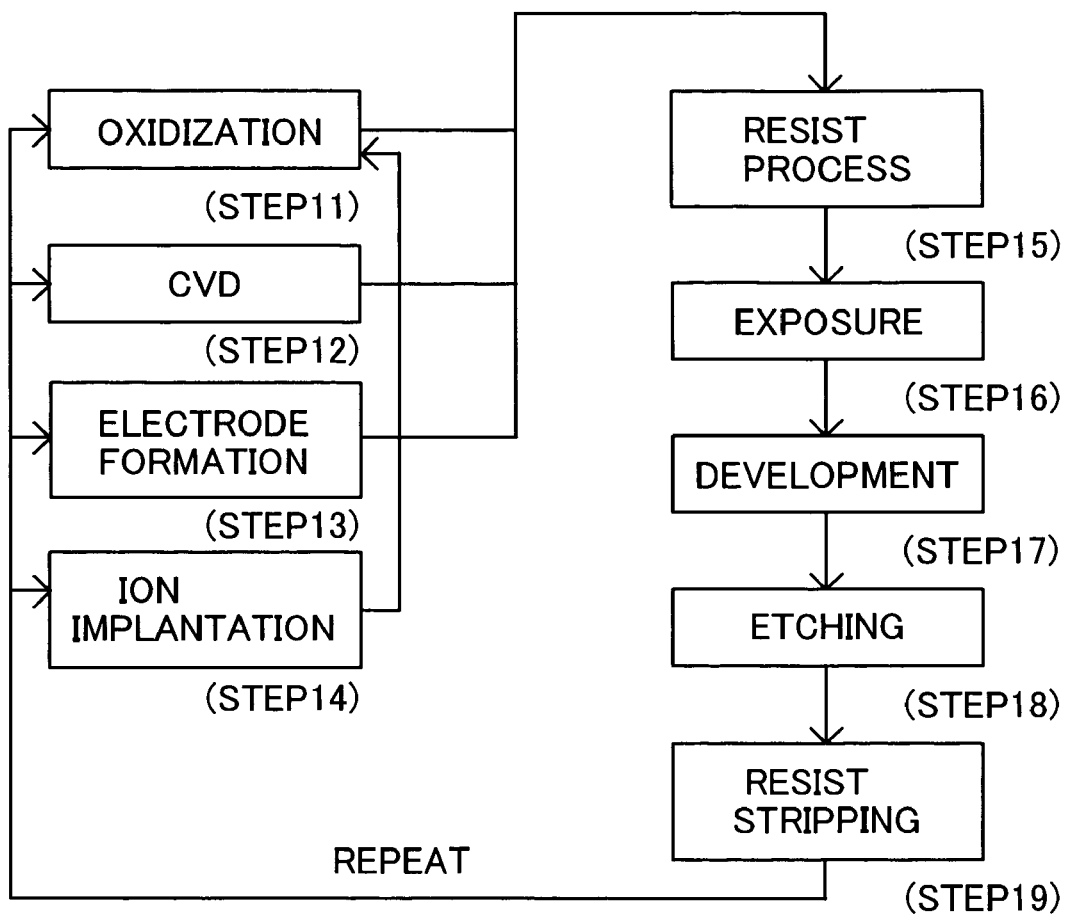
FIG. 11 is a detailed flowchart of a wafer process in Step 4 of FIG. 10.

Referring now to FIGS. 10 and 11, a description will be given of an embodiment of a device fabricating method using the above EUV exposure apparatus 100. FIG. 10 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4 in FIG. 10. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the EUV exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture a higher quality device than the conventional method.

The present invention provides the EUV exposure apparatus that maintains the safety, enables fine fabrication, and can improve the productivity.

Further, the present invention is not limited to these preferred embodiments, and various variations and modifications may be made without departing from the scope of the present invention.

This application claims a foreign priority benefit based on Japanese Patent Applications No. 2004-116017, filed on Apr. 9, 2004, which is hereby incorporated by reference herein in its entirety as if fully set forth herein.

What is claimed is:

1. An exposure apparatus for exposing a mask pattern onto an object by using a light with wavelength of approximately 11 nm, said exposure apparatus comprising:

a projection optical system that includes a reflection-type optical element that has a multilayer film including a Be layer: and a reflection-type mask comprising:

a multilayer film that includes a first layer that has a first refractive index, and a second layer that has a second refractive index that has a real part that is larger than a real part of the first refractive index, said reflection-type mask includes the mask pattern, wherein said the first layer includes a beryllium, chrome, cobalt, niobium, molybdenum, technetium, ruthenium, rhodium, palladium, or tungsten, wherein said the second layer includes a lithium, boron, carbon, nitrogen, oxygen, fluorine, silicon, aluminum, titanium, scandium, iron, germanium, lanthanum, magnesium, tungsten, strontium, yttrium, or zirconium and, wherein a difference between the real part of the first refractive index and the real part of the second refractive index is 0.2 or more.

2. An exposure apparatus according to claim 1, wherein a combination of the first layer and the second layer of the reflection-type mask is a molybdenum/yttrium, molybdenum/strontium, molybdenum/silicon, ruthenium/boron carbide, ruthenium/boron nitride, rhodium/boron carbide, rhodium/boron nitride, or rhodium/yttrium.

3. A device fabrication method comprising the step of:
exposing an object using an exposure apparatus according to claim 1; and
performing a development process for the object exposed.

* * * * *